US011352711B2

United States Patent
Lee et al.

(10) Patent No.: US 11,352,711 B2
(45) Date of Patent: Jun. 7, 2022

(54) FLUID RECOVERY IN SEMICONDUCTOR PROCESSING

(71) Applicant: Applied Materials, Inc., Santa Clara, CA (US)

(72) Inventors: Sam Lee, Kalispell, MT (US); Kyle M. Hanson, Kalispell, MT (US); Eric J. Bergman, Kalispell, MT (US)

(73) Assignee: Applied Materials, Inc., Santa Clara, CA (US)

( * ) Notice: Subject to any disclaimer, the term of this patent is extended or adjusted under 35 U.S.C. 154(b) by 345 days.

(21) Appl. No.: 16/513,434

(22) Filed: Jul. 16, 2019

(65) Prior Publication Data

US 2021/0017665 A1 Jan. 21, 2021

(51) Int. Cl.
   C25D 21/08 (2006.01)
   H01L 21/02 (2006.01)
   H01L 21/67 (2006.01)
   C25D 17/00 (2006.01)

(52) U.S. Cl.
   CPC ........... *C25D 21/08* (2013.01); *C25D 17/001* (2013.01); *H01L 21/02068* (2013.01); *H01L 21/6715* (2013.01)

(58) Field of Classification Search
   CPC combination set(s) only.
   See application file for complete search history.

(56) References Cited

U.S. PATENT DOCUMENTS

2005/0072358 A1* 4/2005 Katsuoka .......... H01L 21/67051
118/719

FOREIGN PATENT DOCUMENTS

CN   100431092 C   11/2008
TW   2014-07678 A   2/2014

* cited by examiner

*Primary Examiner* — Erin F Bergner
(74) *Attorney, Agent, or Firm* — Kilpatrick Townsend & Stockton LLP (57) ABSTRACT

Cleaning substrates or electroplating system components may include methods of rinsing a substrate at a semiconductor plating chamber. The methods may include moving a head from a plating bath to a first position. The head may include a substrate coupled with the head. The methods may include rotating the head for a first period of time to sling bath fluid back into the plating bath. A residual amount of bath fluid may remain. The methods may include delivering a first fluid to the substrate from a first fluid nozzle to at least partially expel the residual amount of bath fluid back into the plating bath. The methods may include moving the head to a second position. The methods may include rotating the head for a second period of time. The methods may also include delivering a second fluid across the substrate from a second fluid nozzle.

18 Claims, 6 Drawing Sheets

FLUID RECOVERY IN SEMICONDUCTOR PROCESSING

TECHNICAL FIELD

The present technology relates to cleaning operations in semiconductor processing. More specifically, the present technology relates to systems and methods that perform rinse and recover operations in electroplating systems.

BACKGROUND

Integrated circuits are made possible by processes which produce intricately patterned material layers on substrate surfaces. After formation, etching, and other processing on a substrate, metal or other conductive materials are often deposited or formed to provide the electrical connections between components. Because this metallization may be performed after many manufacturing operations, problems caused during the metallization may create expensive waste substrates or wafers.

During formation of metal materials on a wafer or substrate, a substrate may be submerged within a plating bath followed by metal formation on the substrate. The wafer may be subsequently raised or otherwise moved and then rinsed at the chamber. The rinse may use water that may be sprayed across the surface of the substrate. Several issues may occur during this process. For example, water may fall into the plating bath causing dilution, which may cause rinse times to be shortened or be performed differently in an attempt to reduce dilution. Additionally during this rinse, plating solution from the bath may splash onto the wafer or chamber components causing staining of the wafer or chamber from the chemicals. In some processing, the rinse may also drain residual bath fluid on the substrate, which may increase costs associated with processing operations by removing a portion of the plating bath with each substrate.

Thus, there is a need for improved systems and methods that can be used to produce high quality devices and structures while protecting both the substrate and the plating baths. These and other needs are addressed by the present technology.

SUMMARY

Cleaning substrates or electroplating system components may include methods of rinsing a substrate at a semiconductor plating chamber. The methods may include moving a head from a plating bath to a first position. The head may include a substrate coupled with the head. The methods may include rotating the head for a first period of time to sling bath fluid back into the plating bath. A residual amount of bath fluid may remain on the substrate. The methods may include delivering a first fluid to the substrate from a first fluid nozzle to at least partially expel the residual amount of bath fluid back into the plating bath. The methods may include moving the head to a second position. The methods may include rotating the head for a second period of time. The methods may also include delivering a second fluid across the substrate from a second fluid nozzle.

In some embodiments, the first fluid nozzle and the second fluid nozzle each extend through a weir positioned about the semiconductor plating chamber. The weir may be fluidly coupled with a collection channel defined by a rinse frame extending above and radially outward of the plating bath. The first position may be between the plating bath and a height defined by an inner edge of the weir. The second position may be above the height defined by an inner edge of the weir. Delivering the first fluid may include a first volume of fluid that may be delivered at a first volumetric flow rate. Delivering the second fluid may include a second volume of fluid delivered at a second volumetric flow rate. The first volume of fluid may be different from the second volume of fluid and the first volumetric flow rate may be different from the second volumetric flow rate. The second volume of fluid may be greater than the first volume of fluid, and the second volumetric flow rate may be greater than the second volumetric flow rate. The first fluid may be or include a fluid compatible with the plating bath. The first fluid and the second fluid may be different fluids. The first period of time may extend at least until the first fluid has been delivered to the substrate. Subsequent the first period of time, the head may continue to rotate for a third period of time to recover the residual amount of bath fluid back into the plating bath. The head may be raised towards the second position during the first period of time. While raising the head during the first period of time, the first fluid may be slung to contact a weir through which the first fluid nozzle extends.

Some embodiments of the present technology may also encompass methods of rinsing a substrate at a semiconductor plating chamber. The methods may include moving a head from a plating bath to a first position. The head may include a seal and a substrate coupled with the seal. The methods may include rotating the head for a first period of time. The methods may include delivering a first fluid to the substrate from a first fluid nozzle to expel a residual amount of bath fluid on the substrate back into the plating bath. The methods may include moving the head towards a second position while delivering the first fluid to the substrate from the first fluid nozzle. The methods may include rotating the head at the second position. The methods may include delivering a second fluid across the substrate from a second fluid nozzle. Rotating the head at the second position may sling the second fluid from a radial edge of the substrate to a collection channel defined by a rinse frame extending above and radially outward of the plating bath.

In some embodiments the first period of time may extend at least until the first fluid has been delivered to the substrate. The methods may also include delivering the first fluid while moving the head from the plating bath to the first position, wherein the first fluid impinges on the seal. The methods may include halting the delivery of the first fluid prior to or when the head reaches the first position and prior to rotating the head for a first period of time. The methods may recover at least about 50% of the residual amount of bath fluid. Delivering the first fluid may include delivering a first volume of the first fluid. Delivering the second fluid may include delivering a second volume of the second fluid. The second volume may be greater than the first volume.

Some embodiments of the present technology may also encompass methods of rinsing a substrate at a semiconductor plating chamber. The methods may include delivering a treatment fluid to a substrate seated on a head from a first fluid nozzle. The head may be located at a first position within the semiconductor plating chamber. The methods may include lowering the head into a plating bath from the first position. The methods may include moving the head from the plating bath to the first position. The methods may include rotating the head to sling bath fluid back into the plating bath. A residual amount of bath fluid may remain. The methods may include delivering a first fluid to the substrate from the first fluid nozzle to at least partially expel the residual amount of bath fluid back into the plating bath.

In some embodiments the methods may include moving the head to a second position. The methods may include rotating the head. The methods may include delivering a second fluid across the substrate from a second fluid nozzle. The methods may recover at least about 50% of the residual amount of bath fluid Such technology may provide numerous benefits over conventional technology. For example, the present technology may reduce or limit electroplating bath loss from the system. Additionally, the systems may limit or reduce bath dilution from rinse solution, which may allow extended cleaning processes with less additional bath fluid. These and other embodiments, along with many of their advantages and features, are described in more detail in conjunction with the below description and attached figures.

BRIEF DESCRIPTION OF THE DRAWINGS

A further understanding of the nature and advantages of the disclosed embodiments may be realized by reference to the remaining portions of the specification and the drawings.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the figures, similar components and/or features may have the same numerical reference label. Further, various components of the same type may be distinguished by following the reference label by a letter that distinguishes among the similar components and/or features. If only the first numerical reference label is used in the specification, the description is applicable to any one of the similar components and/or features having the same first numerical reference label irrespective of the letter suffix.

DETAILED DESCRIPTION

Various operations in semiconductor manufacturing and processing are performed to produce vast arrays of features across a substrate. As layers of semiconductor materials are formed, vias, trenches, and other pathways are produced within the structure. These features may then be filled with a conductive or metal material that allows electricity to conduct through the device from layer to layer.

Electroplating operations may be performed to provide conductive material into vias and other features on a substrate. Electroplating utilizes an electrolyte bath containing ions of the conductive material to electrochemically deposit the conductive material onto the substrate and into the features defined on the substrate. The substrate on which metal is being plated operates as the cathode. An electrical contact, such as a ring or pins, may allow the current to flow through the system. During electroplating, a substrate may be clamped to a head and submerged in the electroplating bath to form the metallization. In systems as described below, the substrate may also be chucked within a seal that may be coupled with the head during processing. When the substrate is moved or raised after plating, it may be rinsed with water, such as deionized water, prior to being sent to another plating chamber or some other processing location. Rinsing a wafer and head seal within a plating chamber before moving to another plating chamber may be preferred over moving the components to a stand-alone rinse chamber because of the reduced system footprint, operational cost, and number of robot movements required. However, as noted above, several issues may occur during this rinsing operation.

Conventional technologies may rinse the substrate directly over the bath from a nozzle that ejects rinsing fluid from a side of the chamber towards a center of the substrate. The substrate may be rotated at some speed during the rinsing, which may draw the water across the substrate and sling the water into a catch located at an exterior of the chamber. During the delivery, water may fall into the electrolyte bath, which may splash solution up onto the wafer. This may cause staining of the substrate, or may bring electrolyte to a subsequent bath having a different solution, which may contaminate the second bath. Additionally, plating chambers may accommodate multiple substrate sizes, and thus, for example, a 200 mm semiconductor wafer and a 300 mm semiconductor wafer may be processed in the same chamber. During the sling operation, the smaller diameter 200 mm wafer may not fully deliver rinse fluid into the catch, which may cause it to be delivered into the electrolyte bath. This may cause more substantial dilution of the bath, which may limit the amount of rinsing that may be performed. Additionally, when drawn from the bath, a residual amount of bath fluid may be retained on the substrate, which may be lost in the rinsing operation and require replacement at certain intervals.

The present technology overcomes these issues by incorporating a staged cleaning system that may perform an in situ clean of the wafer, while protecting the wafer and the electrolyte bath. The system may include a first nozzle configured to perform a recovery rinse to limit drag out of the bath fluid from the chamber. The system may also include a second nozzle configured to perform a rinse to clean or treat the substrate, which may be performed to limit fluid delivery into the bath. By utilizing cleaning systems according to the present technology, cleaning may be performed more economically, and more efficiently, and bath fluids may be maintained or recovered. An improved rinsing within a chamber, while avoiding dilution and staining, is also a valuable advancement for processing wafers. Such a chamber may give flexibility of rinse recipe steps, wafer positions, and flow rates to provide improved results without the concerns of dilution and staining. After describing an exemplary chamber on which embodiments of the present technology may be coupled, the remaining disclosure will discuss aspects of the systems and processes of the present technology.

Figure 1:
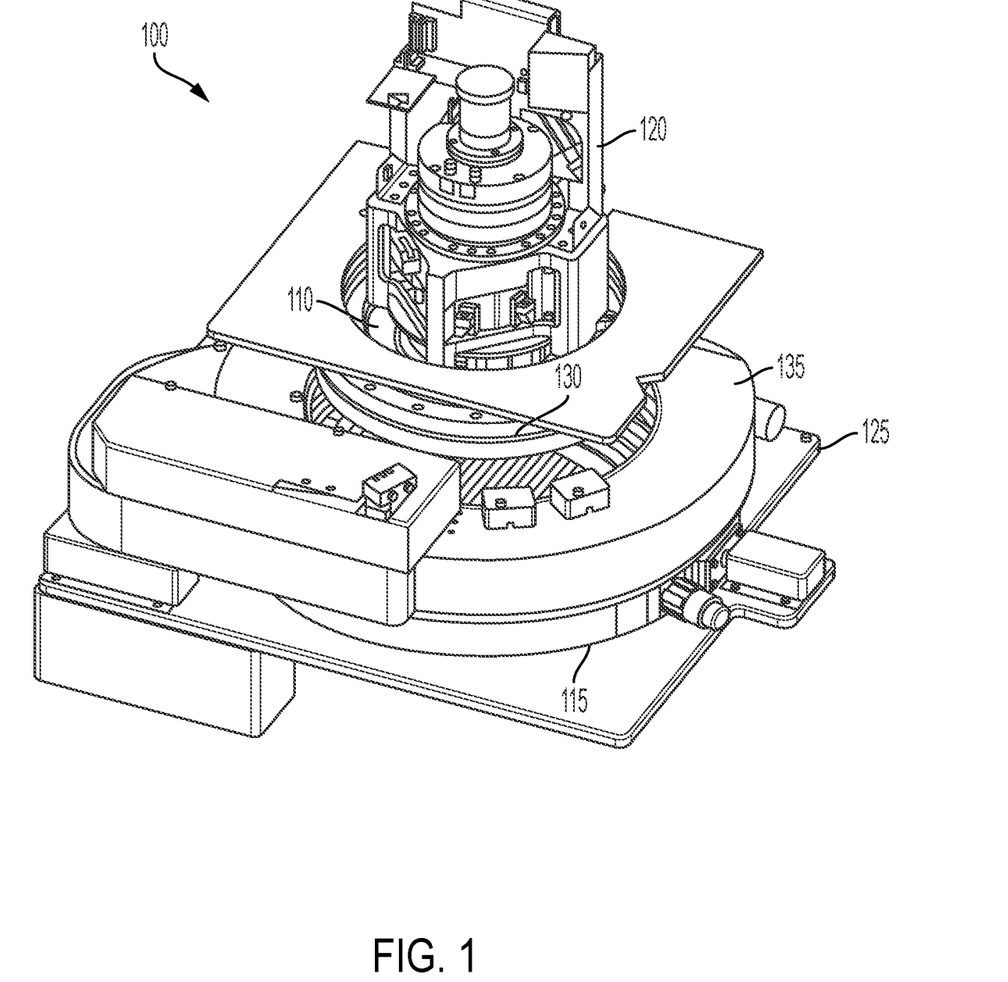
FIG. 1 shows a schematic perspective view of a chamber on which cleaning technology may be coupled according to some embodiments of the present technology.

FIG. 1 shows a schematic isometric view of an electroplating system 100 for which methods and cleaning systems may be utilized and practiced according to embodiments of the present technology. Electroplating system 100 illustrates an exemplary electroplating system including a system head 110 and a bowl 115. During electroplating operations, a wafer may be clamped to the system head 110, inverted, and extended into bowl 115 to perform an electroplating operation. Electroplating system 100 may include a head lifter 120, which may be configured to both raise and rotate the head 110, or otherwise move or position the head within the system including tilting operations. The head and bowl may be attached to a deck plate 125 or other structure that may be part of a larger system incorporating multiple electroplating systems 100, and which may share electrolyte and other materials.

A rotor may allow a substrate clamped to the head to be rotated within the bowl, or outside the bowl in different operations. The rotor may include a contact ring, which may provide the conductive contact with the substrate. A seal 130 discussed further below may be connected with the head. Seal 130 may include a chucked wafer to be processed. FIG. 1 illustrates an electroplating chamber that may include components to be cleaned directly on the platform. It is to be understood that other configurations are possible, including platforms on which the head is moved to an additional module and seal or other component cleaning is performed. Additionally, one or more components, such as seal 130 may be removed from a respective chamber and placed in a maintenance system or cleaning system for cleaning. Any number of other operations may be performed that provide or expose a component for cleaning. An exemplary in situ rinse system 135 is also illustrated with the system 100, and will be described in further detail below.

Figure 2:
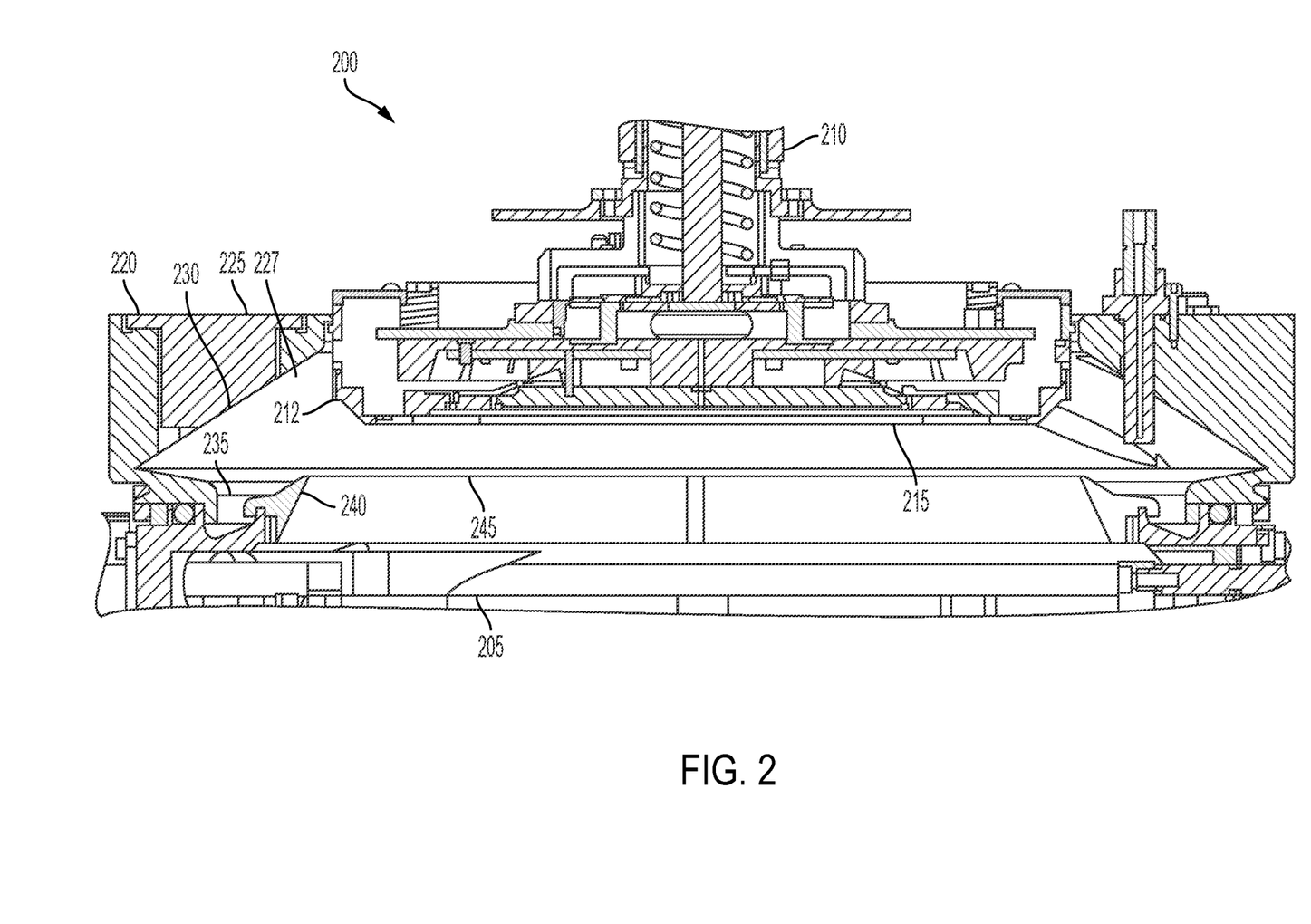
FIG. 2 shows a partial cross-sectional view of a chamber including aspects of rinsing components according to some embodiments of the present technology.

Turning to FIG. 2 is shown a partial cross-sectional view of a chamber including aspects of an electroplating apparatus 200 according to some embodiments of the present technology. The electroplating apparatus 200 may be incorporated with an electroplating system, including system 100 described above. As illustrated in FIG. 2, a plating bath vessel 205 of an electroplating system is shown along with a head 210 having a substrate 215 coupled with the head. The substrate may be coupled with a seal 212 incorporated on the head in some embodiments. A rinsing frame 220 may be coupled above the plating bath vessel 205, and may be configured to receive the head into the vessel during plating. Rinsing frame 220 may include a rim 225 extending circumferentially about an upper surface of the plating bath vessel 205. A rinsing channel 227 may be defined between the rim 225 and an upper surface of the plating bath vessel 205. For example, rim 225 may include interior sidewalls 230 characterized by a sloping profile. As described above, rinse fluid slung off a substrate may contact the sidewalls 230, and may be received in a plenum 235 extending about the rim for collection of the rinse fluid from the electroplating apparatus 200. A weir 240 may extend about the plating bath vessel 205 and may be fluidly coupled with the plenum 235 or collection channel to further limit slung fluid from returning to the plating bath. Weir 240 may define a plane 245 across the electroplating apparatus, through which the head 210 may extend to enter the plating bath vessel 205, and through which the head may return to perform a rinsing operation.

Electroplating apparatus 200 may additionally include one or more cleaning components in some embodiments, which may be used in a number of methods for in situ component cleaning. The components may include one or more nozzles used to deliver fluids to or towards the substrate 215 or the head 210. By delivering rinse fluid, such as deionized water or other rinse fluids, at angles as illustrated in some embodiments, the velocity of the delivery may be reduced, and rotation of the head may be used to draw the rinse fluid radially outward along the substrate. The reduced velocity of delivery may limit upward splashing of fluid back down.

Figure 3:
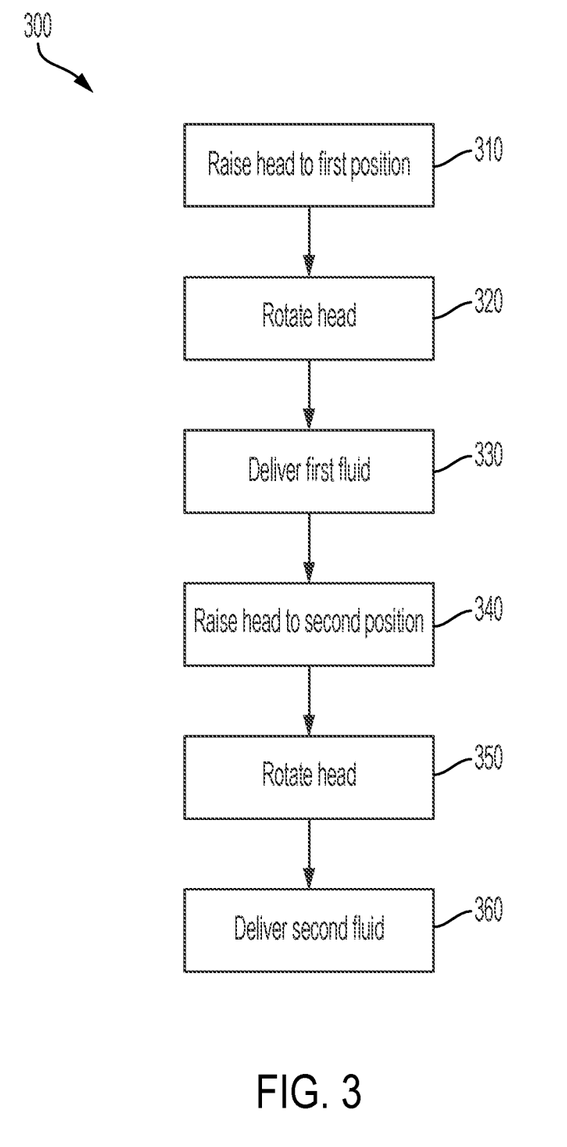
FIG. 3 shows exemplary operations in a method of rinsing a substrate at a semiconductor plating chamber according to some embodiments of the present technology.
Figure 4:
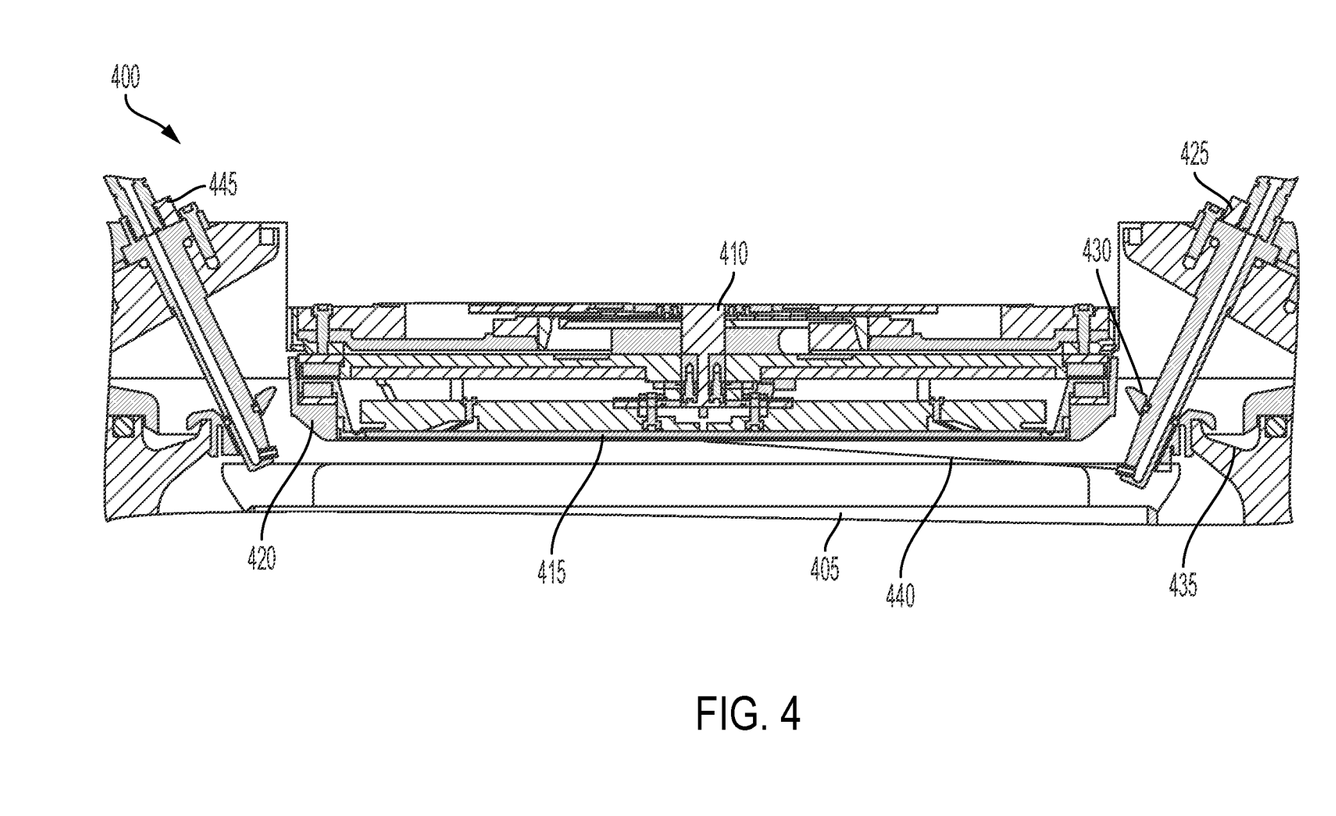
FIG. 4 shows a partial cross-sectional view of a chamber including aspects of rinsing components according to some embodiments of the present technology.
Figure 5:
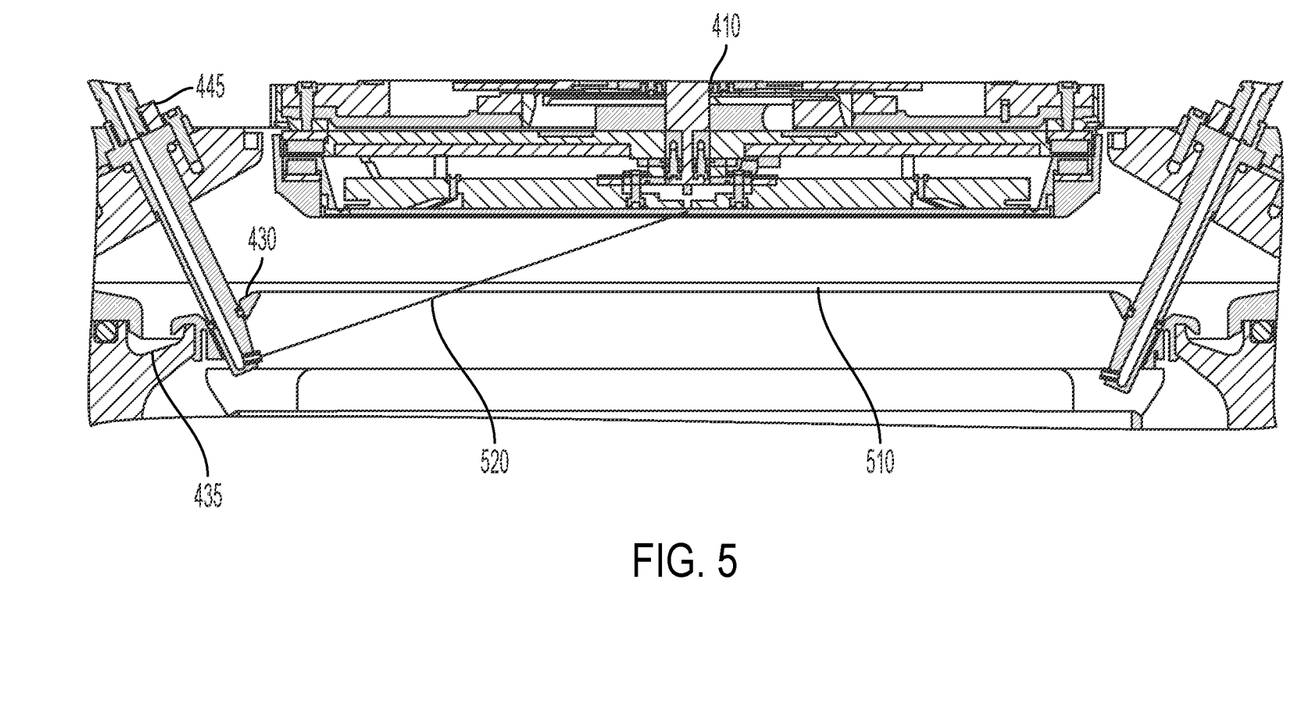
FIG. 5 shows a partial cross-sectional view of a chamber including aspects of rinsing components according to some embodiments of the present technology.

FIG. 3 shows exemplary operations in a method 300 of rinsing a substrate at a semiconductor plating chamber according to some embodiments of the present technology, and which may use any of the components previously described. Method 300 may be performed in one or more electroplating systems, such as electroplating apparatus 200, which may be incorporated into processing system 100, for example, as well as any other semiconductor plating chambers adaptable to perform the operations described. The method may include a number of optional operations in some embodiments, which may or may not be specifically associated with some embodiments of methods according to the present technology. Method 300 describes operations shown schematically in FIG. 4 and FIG. 5, the illustrations of which will be described in conjunction with the operations of method 300. It is to be understood that FIG. 4 and FIG. 5 illustrate only partial schematic views with limited details, and in some embodiments the systems may include more or less components, as well as alternative structural aspects or rearrangements that may still benefit from any of the aspects of the present technology.

Method 300 may include operations prior to the actual substrate cleaning. For example, prior to the cleaning, a system head may deliver a substrate into a plating bath vessel to perform an electroplating operation. The head may be moved or raised at operation 310 from the plating bath. FIG. 4 illustrates an example of a system 400 having a head 410 raised or moved to a first position subsequent a plating operation in plating bath vessel 405. As previously described, the head 410 may include a seal 420 and the substrate 415 may be clamped or coupled with the seal. The first position may be any location out from the bath within the chamber, although in some embodiments the first position may be located at a height from the plating bath vessel below a plane defined by a weir 430 extending about the chamber, as previously described, and which may be fluidly coupled with a collection channel 435 where fluids may be drained from the system. As described previously, sling-off operations may be performed where through rotation of the head 410, fluid may be expelled from the surface of the substrate 415 radially outward from the head 410. When below the plane defined by the weir 430, fluid may be delivered back into the plating bath, while when above the plane defined by the weir 430, fluid may be delivered into the collection channel 435, which may extend above and radially outward of the plating bath 405. Weir 430 may limit or prevent delivery back to the bath of fluids slung from the substrate when above the plane defined by the weir in some embodiments.

The head may be rotated at operation 320 for a first period of time, which as previously described may facilitate slinging bath fluid from the surface of the substrate 415. Because the first position may be below weir 430, the fluid may drain back into the plating bath. As described previously, despite a sling-off operation, a residual amount of bath fluid may remain on the surface of the substrate. Conventional technologies may raise the head 410 to above the plane defined by the weir, such as a second position, and may then rinse the substrate to clear the surface of residual bath fluid. This residual bath fluid may be a few milliliters of fluid in some embodiments, however when extracted from the system in rinsing, this loss may add up per wafer to an extra operational cost. By recovering this residual amount of bath fluid, or a portion of the fluid, operating costs may be reduced. Accordingly, some embodiments of the present technology may include a first rinsing operation to recover residual bath fluid back into the plating bath. However, this first rinsing operation may contribute additional fluid to the bath. To limit dilution or contamination to the bath, the present technology may perform operations that contribute minimal fluid to the bath during a first rinsing operation.

For example, at operation 330, a first fluid 440 may be delivered to the substrate 415 from a first fluid nozzle 425, while the head 410 is at the first position, or within a zone defined between the plating bath and the plane defined by the weir 430. The first fluid may be delivered to push or expel residual bath fluid from the surface of the substrate 415, seal 420, and/or portions of head 410. In some embodiments the first fluid 440 may be delivered towards a center of the substrate while the substrate is rotating, which may draw the first fluid radially outward across the substrate before slinging the first fluid to the side walls of the vessel, and back into the plating bath. As illustrated, first fluid nozzle 425 may extend through weir 430, to provide access to the substrate at the first position, or within a first zone defined between the plating bath and the plane defined by weir 430. The system may also include a second nozzle 445 as illustrated, which in some embodiments may also extend through weir 430. Although shown on opposite sides of the chamber, it is to be understood that the two nozzles may exist at any location about the chamber, including adjacent one another. Second fluid nozzle 445 may extend to a different length through the weir 430 as illustrated, as second fluid nozzle 445 may be used to perform a second rinsing operation when the substrate is positioned above the weir.

Additionally, in some embodiments, a single fluid nozzle may be used for each of the first fluid and the second fluid delivery. The nozzle may include multiple apertures in some embodiments for delivery of separate fluids, or a single nozzle and port may be used to deliver the first fluid and the second fluid. The nozzle may also be moveable or adjustable to deliver fluids at multiple angles or trajectories to provide fluid with the substrate and the first position and/or the second position. Accordingly, in some embodiments, the first fluid nozzle and the second fluid nozzle may be the same nozzle, or two different nozzles as will be illustrated.

Once the first rinsing operation has been completed, the head 410 may be raised or moved to a second position in operation 340, and as illustrated in FIG. 5. The second position may be above the plane 510 defined by the weir 430, such that rinse fluid slung from the substrate may be directed into collection channel 435. At the second position the head 410 may again be rotated at operation 350 for a second period of time, which may be greater than or less than the first period of time. A second fluid 520 may be delivered from the second fluid nozzle 445 at operation 360, which may also be directed towards a center of the substrate in some embodiments. The rotation of the head may facilitate the second fluid being slung from an outer radial edge of the substrate, seal, or head, and into the collection channel 435, where the fluid may be drained from the system. Weir 430 may help to limit or prevent this second fluid from entering the bath in some embodiments, which may limit dilution of the bath.

As noted above, the first fluid may be delivered back into the bath with residual bath fluid from the substrate, and thus in embodiments the first fluid may be a fluid compatible with the plating bath. Although this may be water, such as deionized water, in some embodiments additional fluid may be used, such as acidic solutions or other chemicals that may be compatible with bath fluids, such as copper bath fluids or tin silver bath fluids, for example. Because the first fluid may be delivered into the bath with residual bath fluid, the amount of first fluid may be minimized. The second fluid may be maintained separate from the bath, and delivery into the bath may be limited or prevented by delivering the fluid to the substrate when the head is raised or moved to the second position within the chamber. Because the second fluid may not enter the bath, the fluid may include a number of other cleaning or rinsing agents, which although may include water, such as deionized water, may also include any number of cleaners, acids, organic solvents, or rinsing agents used in any variety of plating systems to clean substrates and/or system components. In embodiments of the present technology, the first fluid and the second fluid may be similar or different from one another during rinsing methods.

As noted, the first fluid may be used in a recovery type rinse, in which residual bath fluid from the substrate and the first fluid may be delivered into the bath when slung from the substrate. Accordingly, in some embodiments minimal first fluid may be used. The cleaning may occur with a combination of factors including the rotational speed of the head, the time of sling off, the amount of first fluid used, as well as environmental characteristics, such as the temperature of the first fluid. For example, the first sling off operation may be performed at a variety of rotational speeds, such as from greater than or about 100 RPM up to or about 1,000 RPM or more, depending on the system components. The size of the wafer may also impact the speed used, where faster rotational speeds may be used for smaller wafers due to the reduced angular momentum, which may otherwise reduce the effectiveness of the sling if not compensated, such as with faster rotation. In some embodiments, higher rotational speeds may affect the head, which may cause an amount of perturbation, such as vertical or radial wobble of the head. Accordingly, in some embodiments, the head may be rotated below or about 1,500 RPM, below or about 1,200 RPM, below or about 1,000 RPM, below or about 800 RPM, below or about 700 RPM, below or about 600 RPM, or less, which again may be at least partially based on system size, components, and operating conditions.

The volume of fluid may be minimized by matching the fluid volume with the rotational speeds in some embodiments. For example, to produce the same reduction in residual bath fluid on the substrate, more fluid may be used at lower rotational speeds relative to higher rotational speeds. To limit the amount of fluid to produce adequate recollection, the head may be rotated at a speed above or about 100 RPM in some embodiments, and may be rotated above or about 250 RPM, above or about 400 RPM, or higher. The first fluid may be delivered as a first volume of fluid, which may be delivered at a first volumetric flow rate. The second fluid may be delivered as a second volume of fluid, which may be delivered at a second volumetric flow rate. Because the second operation may be configured to fully clear or clean the substrate, and because the second fluid may not dilute or contaminate the bath, the second fluid may be delivered at a higher volume, for a longer time, and/or at a higher volumetric flow rate than the first fluid.

For example, the first fluid volume may be less than or about 100 mL in some embodiments, and may be less than or about 50 mL, less than or about 25 mL, less than or about 15 mL, less than or about 10 mL, less than or about 9 mL, less than or about 8 mL, less than or about 7 mL, less than or about 6 mL, less than or about 5 mL, or less. The amount of first fluid that the plating bath may accept may at least partially depend on plating bath conditions. For example, while plating baths operating at or near ambient conditions may afford a first fluid delivery at or below about 10 mL, plating baths operating, for example, at or about 50° C. may be capable of accepting more of the first fluid, such as greater than 10 mL, greater than 20 mL, or more. The flow rate of the first fluid may also be limited or restricted to limit the amount of fluid delivered during a period of fluid delivery.

The second fluid may be delivered at a higher flowrate and/or at a greater volume than the first fluid in some embodiments. For example, the second nozzle may deliver fluid at a flow rate of at least about double the flow rate of the first nozzle, and may deliver fluid at a flow rate that is at least about three times the flow rate of the first nozzle, at least about four times the flow rate of the first nozzle, at least about five times the flow rate of the first nozzle, or more. The volume of second fluid delivered may also be at least about 5 times the volume of first fluid delivered, and may be at least about 10 times the volume of first fluid delivered, at least about 25 times the volume of first fluid delivered, at least about 50 times the volume of first fluid delivered, at least about 75 times the volume of first fluid delivered, at least about 100 times the volume of first fluid delivered, at least about 250 times the volume of first fluid delivered, at least about 500 times the volume of first fluid delivered, or more. Additional differences between the first fluid and the second fluid may include temperature differences, where either fluid may be at a temperature greater than the other fluid, and either fluid may be degassed, nitrogenated, or otherwise modified in embodiments of the present technology.

The delivery may also exhibit one or more optional aspects to method 300 as noted above. For example, in some embodiments rotating the head at operation 320 may be a first rotation to produce a sling-off of bath fluid occurring for a first period of time. The first fluid may then be delivered subsequent the first period of time in some embodiments, which may include an additional rotation of the head at a speed different from the rotation at operation 320. Additionally, the first period of time may extend through delivery of the first fluid, or until the first fluid has been delivered to the substrate. For example, the first period of time may include a first portion of time for a sling-off, a second portion of time during which first fluid is delivered, and/or a third portion of time, which may constitute a third period of time in some embodiments, subsequent delivery of the first fluid to further sling-off residual fluids. The head may be actively rotated during any of these portions or periods of time, although in some embodiments a passive spin, such as during a spin-down operation may occur, which may reduce the overall operational time during the recovery rinse. For example, rotation of the head may occur actively during the first period of time. Prior to, during, or subsequent delivery of the first fluid, active rotation may cease, and a spin-down may occur for a third period of time during which the residual bath fluid and first fluid may be expelled from the substrate.

The head may also be translated vertically during any of these periods of time in some embodiments, and may be adjusted during delivery of the first fluid. For example, first fluid may be delivered towards or at a center of the substrate while the head is rotating, to draw fluid radially outward across the substrate. During this delivery, the head may be raised or moved towards the second position, while still being maintained below the plane defined by the weir, which may further push or express the fluid along the surface of the substrate. Additional advantages may also be provided. For example, the head may be raised or moved during this delivery so that the first fluid may impinge along a radially outward path along the substrate, and may impinge on a position at an external radial edge of the substrate where the substrate meets the seal, which may be characterized by a crevice, which may be rinsed with first fluid in some embodiments, such as where additional first fluid may be acceptable within the plating bath. Additionally, as the head moves, first fluid slung from the substrate may extend upwards along sidewalls of the vessel portion of the chamber, while still remaining below the plane defined by the weir, and which may rinse the nozzles and interior surfaces of the weir. This may limit bath fluid drying on these surfaces, which may crystallize and form deposits on surfaces of the chamber.

In another optional operation, an additional delivery of the first fluid may optionally occur during operation 310 where the head may be raised or moved to the first position. For example, while the head is raising from the bath to the first position, an amount of first fluid may be delivered to impinge on the seal against which the substrate may be clamped, which may rinse bath fluid from the seal, such as on an outer or exterior surface of the seal. The delivery may be halted in some embodiments prior to the substrate reaching the first position. The head may be rotated during this seal rinse operation, and may be rotated at a speed similar to, less than, or greater than any of the noted rotations during the method. At the first position the rotation may be increased, for example, and a sling-off of bath fluid may be performed.

By performing an additional recovery rinse according to embodiments of the present technology, at least 30% of a residual amount of bath fluid retained on a substrate subsequent a sling-off operation may be recovered. In some embodiments greater than or about 40% of a residual amount of bath fluid retained may be recovered, greater than or about 50% may be recovered, greater than or about 55% may be recovered, greater than or about 60% may be recovered, greater than or about 65% may be recovered, greater than or about 70% may be recovered, greater than or about 75% may be recovered, greater than or about 80% may be recovered, greater than or about 85% may be recovered, greater than or about 90% may be recovered, or more.

At the second position, second fluid nozzle 445 may deliver second fluid to the substrate for a rinsing operation. Second fluid nozzle 445 may be sized greater than first fluid nozzle 425 in some embodiments, which may provide an increased fluid flow rate. The second fluid nozzle 445 may not extend as far through weir 430 as first fluid nozzle 425 as second fluid nozzle 445 may be afforded a greater contact angle based on the head being withdrawn farther from the bath. Additionally, second fluid nozzle 445 may be characterized by a different nozzle angle from the first fluid nozzle, which may again be at least partially based on the different head position between the first rinsing operation and second rinsing operation. The head may be rotated at any of the speeds discussed previously during the rotation in the second position, and may be rotated faster or slower than in the first position. Rinse fluid may be slung from the outer radial edge of the substrate and/or seal to the collection channel 435, and out from the chamber.

Figure 6:
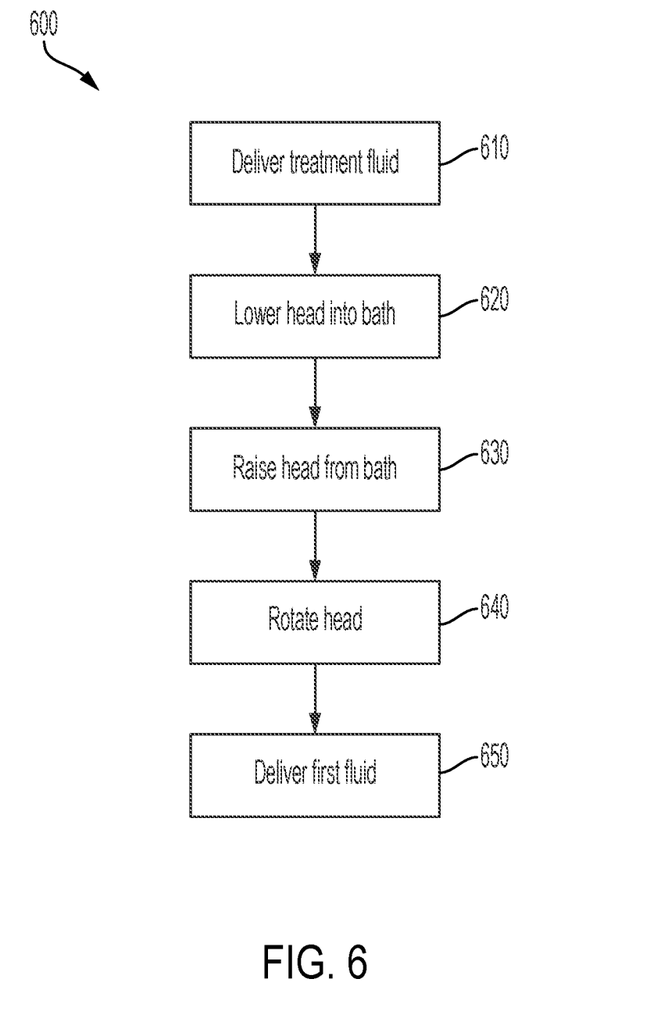
FIG. 6 shows exemplary operations in a method of rinsing a substrate at a semiconductor plating chamber according to some embodiments of the present technology.

First nozzles incorporated in embodiments of the present technology may also be used in methods performing a pretreatment of a substrate in some embodiments. For example, a pretreatment fluid may be flowed through the same nozzle or a paired port with the first nozzle delivering a different fluid from the first nozzle in some embodiments, or the same fluid as first fluid in some embodiments. FIG. 6 shows exemplary operations in a method 600 of rinsing a substrate at a semiconductor plating chamber according to some embodiments of the present technology in which a treatment fluid may be delivered to the substrate. Method 600 may be performed in any of the chambers previously described, and may include any component or operational characteristic described above.

At operation 610, a treatment fluid may be delivered with the first fluid nozzle to the substrate. Unlike the first fluid, which may be configured to remove bath fluid, the treatment fluid may be configured to improve or facilitate plating. The treatment fluid may be delivered from the same nozzle as the first fluid nozzle, or the first fluid nozzle may have two ports in some embodiments from which two different fluids, such as a treatment fluid and a first fluid for rinsing. The treatment fluid may be delivered when the head is in the first position, and while the head may optionally be rotated. Treatment fluids may include any number of different fluids including wetting agents, pretreatment formulas, surfactants, bath fluid, or any other materials which may improve or facilitate plating operations. At operation 620 the head may lower or move the treated substrate into the bath from the first position to perform a plating operation. The head may be raised or moved at operation 630 back to or towards the first position, and any of the previously described method operations may be performed. For example, at operation 640 the head may be rotated to perform a first sling-off operation during which or after which a first fluid may be delivered to the substrate at operation 650 to perform a rinse as previously described. Any number of additional operations may be performed as discussed previously. By performing recovery rinses according to embodiments of the present technology, minimal bath dilution may be produced, while recovering a significant amount of residual bath fluid from a surface of the substrate. This may lower operational costs, and extend the number of substrates that may be plated before refreshing the bath.

In the preceding description, for the purposes of explanation, numerous details have been set forth in order to provide an understanding of various embodiments of the present technology. It will be apparent to one skilled in the art, however, that certain embodiments may be practiced without some of these details, or with additional details. For example, other substrates that may benefit from the wetting techniques described may also be used with the present technology.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included. Where multiple values are provided in a list, any range encompassing or based on any of those values is similarly specifically disclosed.

As used herein and in the appended claims, the singular forms "a", "an", and "the" include plural references unless the context clearly dictates otherwise. Thus, for example, reference to "a material" includes a plurality of such materials, and reference to "the channel" includes reference to one or more channels and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

What is claimed is:

1. A method of rinsing a substrate at a semiconductor plating chamber, the method comprising:
    moving a head from a plating bath to a first position, the head comprising a substrate coupled with the head;
    rotating the head for a first period of time to sling bath fluid back into the plating bath, wherein a residual amount of bath fluid remains;
    delivering a first fluid to the substrate from a first fluid nozzle to at least partially expel the residual amount of bath fluid back into the plating bath;
    moving the head to a second position;
    rotating the head for a second period of time; and
    delivering a second fluid across the substrate from a second fluid nozzle to rinse the substrate, wherein the first fluid nozzle and the second fluid nozzle each extend through a weir positioned about the semiconductor plating chamber, and wherein the weir is fluidly coupled with a collection channel defined by a rinse frame extending above and radially outward of the plating bath.

2. The method of rinsing a substrate at a semiconductor plating chamber of claim 1, wherein the first position is between the plating bath and a height defined by an inner edge of the weir, and wherein the second position is above the height defined by an inner edge of the weir.

3. The method of rinsing a substrate at a semiconductor plating chamber of claim 1, wherein delivering the first fluid comprises a first volume of fluid that is delivered at a first volumetric flow rate, wherein delivering the second fluid comprises a second volume of fluid delivered at a second volumetric flow rate, wherein the first volume of fluid is different from the second volume of fluid and the first volumetric flow rate is different from the second volumetric flow rate.

4. The method of rinsing a substrate at a semiconductor plating chamber of claim 3, wherein the second volume of fluid is greater than the first volume of fluid, and wherein the second volumetric flow rate is greater than the second volumetric flow rate.

5. The method of rinsing a substrate at a semiconductor plating chamber of claim 1, wherein the first fluid comprises a fluid compatible with the plating bath.

6. The method of rinsing a substrate at a semiconductor plating chamber of claim 1, wherein the first fluid and the second fluid are different fluids.

7. The method of rinsing a substrate at a semiconductor plating chamber of claim 1, wherein the first period of time extends at least until the first fluid has been delivered to the substrate.

8. The method of rinsing a substrate at a semiconductor plating chamber of claim 7, wherein, subsequent the first period of time, the head continues to rotate for a third period of time to recover the residual amount of bath fluid back into the plating bath.

9. The method of rinsing a substrate at a semiconductor plating chamber of claim 1, wherein the head is raised towards the second position during the first period of time.

10. The method of rinsing a substrate at a semiconductor plating chamber of claim 9, wherein, while raising the head during the first period of time, the first fluid is slung to contact a weir through which the first fluid nozzle extends.

11. A method of rinsing a substrate at a semiconductor plating chamber, the method comprising:
- moving a head from a plating bath to a first position, the head comprising a seal and a substrate coupled with the seal;
- rotating the head for a first period of time;
- delivering a first fluid to the substrate from a first fluid nozzle to expel a residual amount of bath fluid on the substrate back into the plating bath;
- moving the head towards a second position while delivering the first fluid to the substrate from the first fluid nozzle;
- rotating the head at the second position; and
- delivering a second fluid across the substrate from a second fluid nozzle to rinse the substrate, wherein rotating the head at the second position slings the second fluid from a radial edge of the substrate to a collection channel defined by a rinse frame extending above and radially outward of the plating bath.

12. The method of rinsing a substrate at a semiconductor plating chamber of claim 11, wherein the first period of time extends at least until the first fluid has been delivered to the substrate.

13. The method of rinsing a substrate at a semiconductor plating chamber of claim 11, further comprising delivering the first fluid while moving the head from the plating bath to the first position, wherein the first fluid impinges on the seal.

14. The method of rinsing a substrate at a semiconductor plating chamber of claim 13, further comprising halting the delivery of the first fluid prior to or when the head reaches the first position and prior to rotating the head for a first period of time.

15. The method of rinsing a substrate at a semiconductor plating chamber of claim 11, wherein the method recovers at least about 50% of the residual amount of bath fluid.

16. The method of rinsing a substrate at a semiconductor plating chamber of claim 11, wherein delivering the first fluid comprises delivering a first volume of the first fluid, wherein delivering the second fluid comprises delivering a second volume of the second fluid, and wherein the second volume is greater than the first volume.

17. A method of rinsing a substrate at a semiconductor plating chamber, the method comprising:
- delivering a treatment fluid to a substrate seated on a head from a first fluid nozzle, wherein the head is located at a first position within the semiconductor plating chamber;
- lowering the head into a plating bath from the first position;
- moving the head from the plating bath to the first position;
- rotating the head to sling bath fluid back into the plating bath, wherein a residual amount of bath fluid remains;
- delivering a first fluid to the substrate from the first fluid nozzle to at least partially expel the residual amount of bath fluid back into the plating bath;
- moving the head to a second position;
- rotating the head; and
- delivering a second fluid across the substrate from a second fluid nozzle to rinse the substrate, wherein the first fluid nozzle and the second fluid nozzle each extend through a weir positioned about the semiconductor plating chamber, and wherein the weir is fluidly coupled with a collection channel defined by a rinse frame extending above and radially outward of the plating bath.

18. The method of rinsing a substrate at a semiconductor plating chamber of claim 17, wherein the method recovers at least about 50% of the residual amount of bath fluid.

* * * * *